(12) United States Patent
Endo et al.

(10) Patent No.: US 7,470,621 B2
(45) Date of Patent: Dec. 30, 2008

(54) METHOD FOR MANUFACTURING SEMICONDUCTOR DEVICE

(75) Inventors: Taichi Endo, Kanagawa (JP); Teruyuki Fujii, Kanagawa (JP); Kiyofumi Ogino, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 350 days.

(21) Appl. No.: 11/480,895

(22) Filed: Jul. 6, 2006

(65) Prior Publication Data

US 2007/0010036 A1 Jan. 11, 2007

(30) Foreign Application Priority Data

Jul. 11, 2005 (JP) .............................. 2005-201941

(51) Int. Cl.
*H01L 21/302* (2006.01)
(52) U.S. Cl. ....................................... 438/689; 438/745
(58) Field of Classification Search ................ 438/689, 438/725, 745, 749, 756, 757; 430/3, 7, 330
See application file for complete search history.

(56) References Cited

U.S. PATENT DOCUMENTS 5,419,991 A * 5/1995 Segawa ........................ 430/20
5,888,679 A * 3/1999 Suzuki et al. .................. 430/7
6,127,072 A * 10/2000 Shiba et al. .................... 430/7
2004/0091820 A1 5/2004 Nagai et al.

FOREIGN PATENT DOCUMENTS

| JP | 08-078329 | 3/1996 |
| JP | 2000-294378 | 10/2000 |
| JP | 2004-172598 | 6/2004 |

* cited by examiner

*Primary Examiner*—Tuan H Nguyen
(74) *Attorney, Agent, or Firm*—Nixon Peabody LLP; Jeffrey L. Costellia

(57) ABSTRACT

It is an object of the present invention to provide a method for manufacturing a semiconductor device that can suppress generation of a crack and peeling in a resin BM and deterioration of coverage of an upper layer of the resin BM, even if a black resin is used as a material of the resin BM in order to improve a contrast of brightness and a contrast of color. As a method for manufacturing a semiconductor device, a non-photosensitive black resin layer is formed over a substrate, a positive resist film is formed over the non-photosensitive black resin layer, the positive resist film is exposed, a resin black matrix layer made of the non-photosensitive black resin layer is formed over the substrate by developing the positive resist film by using a first developing solution and by etching the non-photosensitive black resin layer, a non-exposed positive resist film over the resin black matrix layer, which remains after the development, is exposed, and the positive resist film is removed by using a second developing solution.

40 Claims, 12 Drawing Sheets

DEVELOPING SOLUTION

DEVELOPING SOLUTION

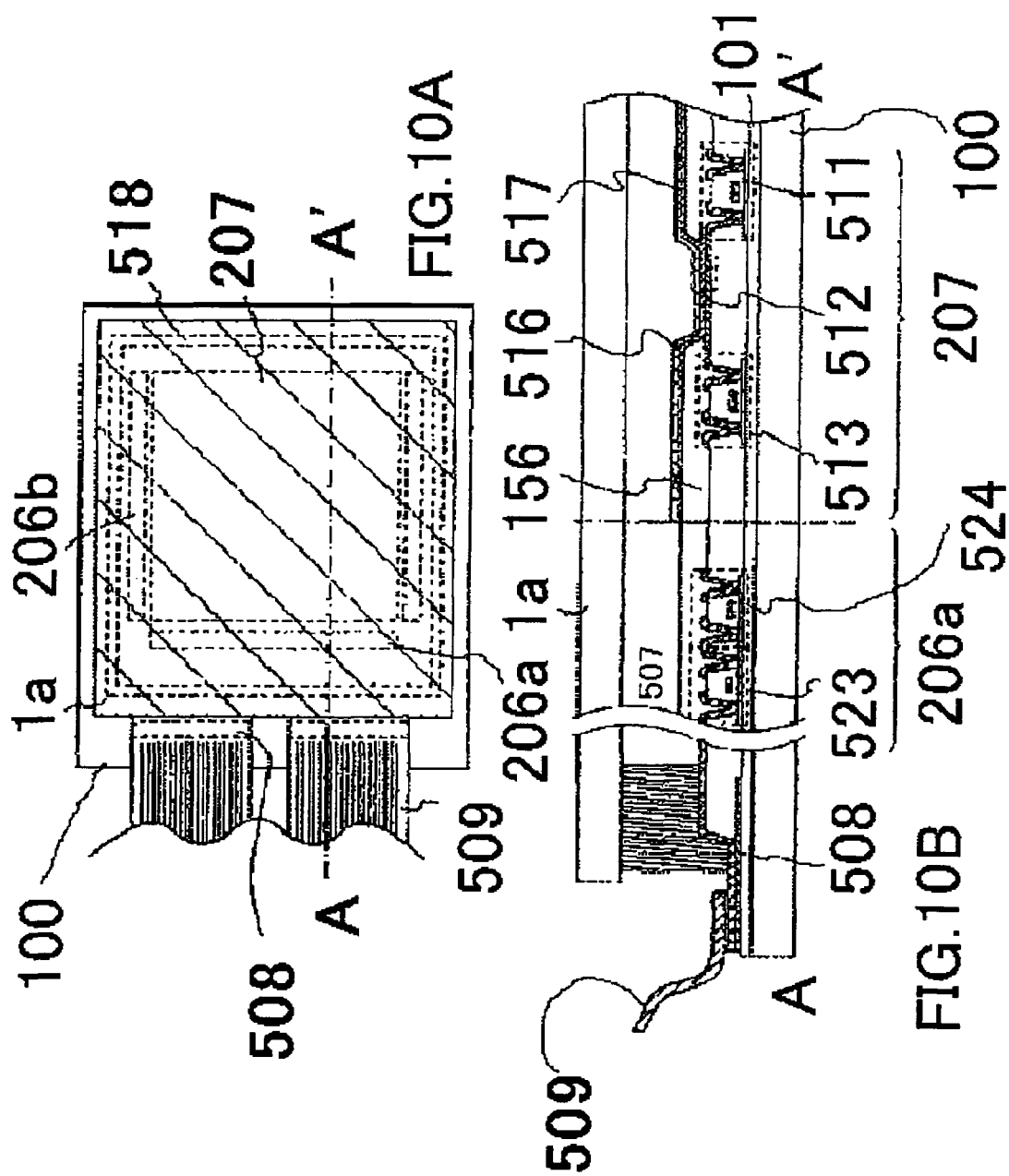

METHOD FOR MANUFACTURING SEMICONDUCTOR DEVICE

BACKGROUND OF THE INVENTION

1. Field of the Invention

The present invention relates to a method for manufacturing a semiconductor device having a resin black matrix layer. In the present specification, a semiconductor device indicates devices in general, which operates by utilizing semiconductor characteristics. Further, a semiconductor device manufactured by the present invention includes a light emitting display device and an electronic apparatus formed using a resin black matrix layer in its category.

2. Description of the Related Art

An insulating partition used for a display device (for example, an organic EL display device) is formed by forming a polyimide film over a substrate and patterning the polyimide film. A patterning method is different depending on photosensitive polyimide and non-photosensitive polyimide. In a case of photosensitive polyimide, a polyimide film is exposed and developed; thereby forming an insulating partition using a polyimide pattern over a substrate. In a case of non-photosensitive polyimide, a polyimide film is patterned by using a resist; thereby forming an insulating partition using a polyimide pattern over a substrate.

[Patent Document 1] Japanese Patent Application Laid-Open No. 2000-294378

SUMMARY OF THE INVENTION

The insulating partition can be made to have a function of a black matrix (light shielding) by using a black resin in which black pigment is dispersed or a black dye is dissolved as a material of the insulating partition. When a resin black matrix that has vividly black color (hereinafter, referred to as a "resin BM") is used, a contrast of brightness or a contrast of color in a displayed image can be sufficiently saved, a difference of light and dark in an image is further clear, and black color can be displayed more vividly. However, when a resin BM is manufactured using such a black resin by a conventional method, a problem described below is caused.

First, a case of using a photosensitive black resin (a photosensitive resin in which black pigment is dispersed or a black dye is dissolved) will be explained. A photosensitive black resin layer to which black pigment or a black dye is added is formed over a substrate. This photosensitive black resin layer is exposed to a light and developed to be patterned, and then, a resin BM made of the photosensitive black resin is formed over the substrate. In the case of using the photosensitive black resin, there is an advantage of small number of pattern forming steps because a resist is not necessary to be used. However, there is a disadvantage of long exposure time because light transmissivity of exposure light is lowered by affection of pigment or a dye included in the photosensitive black resin. When such an advantage and a disadvantage are taken into consideration, a throughput is considered to be lowered as compared to polyimide used as a material of the conventional resin BM in mass production.

Next, a case of using a non-photosensitive black resin (a non-photosensitive resin in which black pigment is dispersed or a black dye is dissolved) will be explained. A non-photosensitive black resin layer to which black pigment or a black dye is added is formed over a substrate. A positive resist film is applied over this non-photosensitive black resin layer, and this positive resist film is exposed to a light and developed to form a resist pattern over the non-photosensitive black resin layer. At this time, the non-photosensitive black resin layer is also etched, and a resin BM made of the non-photosensitive black resin is formed over the substrate. Subsequently, the resist pattern is removed. As a removing method in this point, a case of using a resist peeling solution and a case of using an organic solvent can be considered. If the resist peeling solution is used, the resin BM is removed together. If the resist is removed by using the organic solvent, a crack and peeling is easily generated in the resin BM. Further, a taper angle of a cross-section of the pattern of the resin BM is increased; thereby deteriorating coverage of a light emitting layer or an electrode layer formed over the resin BM. Therefore, there is a defect that a method of removing the resist by using the organic solvent is not suitable for a partition layer dividing a pixel of an organic electroluminescent element.

The present invention is implemented in the view of the foregoing problem. It is an object of the present invention to provide a method for manufacturing a semiconductor device that can suppress generation of a crack and peeling in a resin BM and deterioration of coverage of a layer formed over the resin BM even if a black resin is used as a material of the resin BM in order to improve a contrast of brightness or a contrast of color.

In order to solve the above object, a method for manufacturing a semiconductor device related to the present invention has a feature of including the steps of: forming a non-photosensitive black resin layer over a substrate; forming a positive resist film over the non-photosensitive black resin layer; exposing the positive resist film; forming a resin black matrix layer made of the non-photosensitive black resin layer over the substrate by developing the positive resist film by using a first developing solution and by etching the non-photosensitive black resin layer; exposing a non-exposed positive resist film over the resin black matrix layer, which remains after the development; and removing a positive resist over the resin black matrix layer by using a second developing solution.

According to the method for manufacturing a semiconductor device, after the non-photosensitive black resin layer is etched to form the resin black matrix layer, the non-exposed positive resist film is exposed to a light, and the exposed positive resist film is removed by using the second developing solution. Consequently, generation of a crack and peeling in the resin black matrix layer can be suppressed, and a taper angle of a cross-section of the resin black matrix layer can be reduced. Accordingly, deterioration of coverage of a layer formed over the resin black matrix layer can be suppressed.

A method for manufacturing a semiconductor device related to the present invention has a feature of including the steps of: forming an electrode over an insulating film; forming a non-photosensitive black resin layer over the electrode and the insulating film; forming a positive resist film over the non-photosensitive black resin layer; exposing the positive resist film to a light; forming a resin black matrix layer made of the non-photosensitive black resin layer having an opening portion over the electrode by developing the positive resist film by using a first developing solution and by etching the non-photosensitive black resin layer; exposing a non-exposed positive resist film over the resin black matrix layer to a light, which remains after the development; and removing the positive resist film by using a second developing solution.

According to a method for manufacturing a semiconductor device related to the present invention, a light emitting layer can be formed over the electrode and the resin black matrix layer after the positive resist film is removed; and an electrode, which is provided to be opposed to the electrode, can be formed over the light emitting layer and the resin black matrix layer.

According to a method for manufacturing a semiconductor device related to the present invention, a thin film transistor and a capacitor element can be formed below the insulating film before the electrode is formed over the insulating film.

According to a method for manufacturing a semiconductor device related to the present invention, the first developing solution has the same concentration as the second developing solution; and a processing time using the first developing solution can be longer than or twice or longer (preferably, four times or longer) than a processing time using the second developing solution.

According to a method for manufacturing a semiconductor device related to the present invention, the first developing solution has a higher concentration than the second developing solution; and a processing time using the first developing solution can be equal to or less than four times (preferably, less than twice) a processing time using the second developing solution.

As described above, according to the present invention, a method for manufacturing a semiconductor device can be provided, which can suppress generation of a crack and peeling in the resin BM and deterioration of coverage of a layer formed over the resin BM, even if a black resin is used as a material of the resin BM in order to improve a contrast of brightness or a contrast of color.

BRIEF DESCRIPTION OF DRAWINGS

FIG. 10A is a plane schematic view of a light emitting display device related to Embodiment 3, and FIG. 10B is a cross-sectional view taken along A-A' of FIG. 10A;

DETAILED DESCRIPTION OF THE INVENTION

Figure 1:
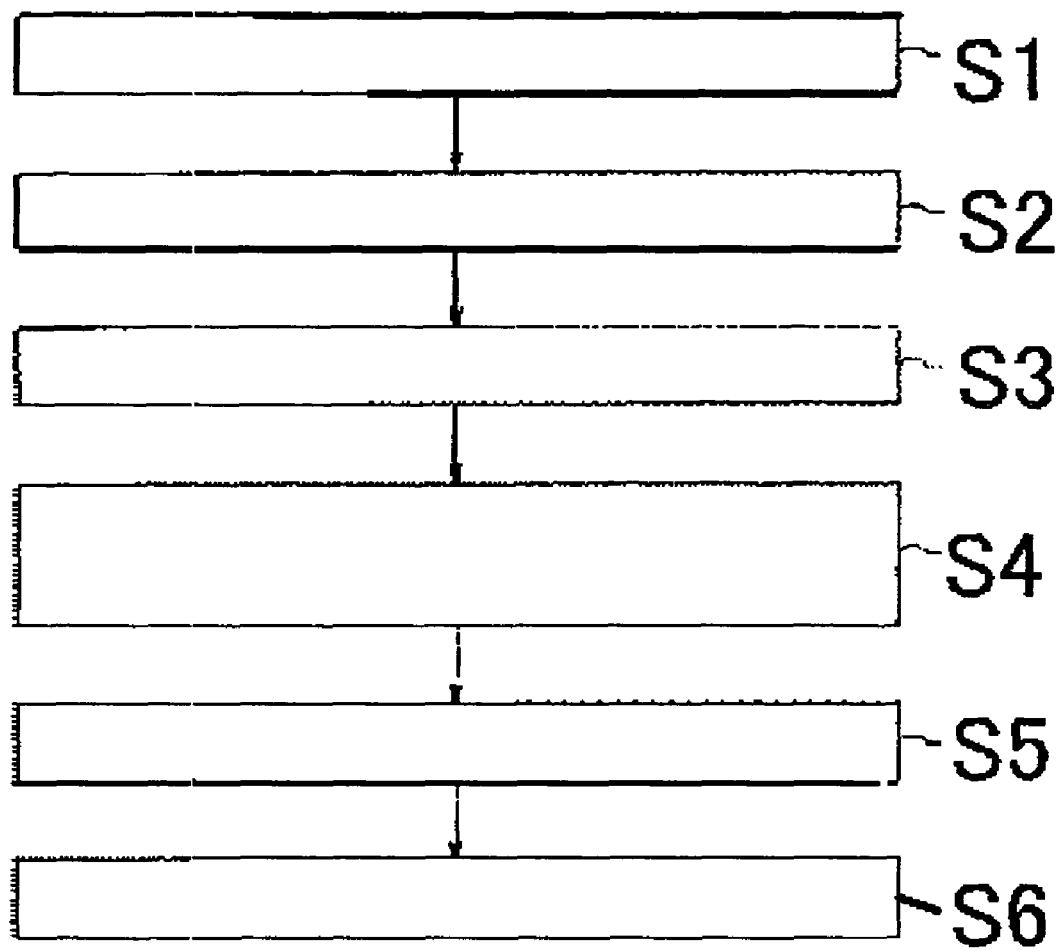
FIG. 1 is a flow diagram for explaining a method for manufacturing a semiconductor device in Embodiment Mode 1 of the present invention.

FIG. 1 shows a flow diagram explaining a method for manufacturing a semiconductor device in accordance with Embodiment Mode 1 of the present invention. First, a non-photosensitive black resin film is applied over a substrate where a transistor is formed by a spin coating method (S1).

Next, a positive resist film is applied over the non-photosensitive black resin film by a spin coating method (S2). Then, a photo mask is arranged on the upper side of the positive resist film, and the positive resist film is irradiated with exposure light through the photo mask. Accordingly, exposure treatment (patterning) is performed (S3).

Thereafter, the positive resist film is developed by using a first developing solution and the non-photosensitive black resin film is etched. Accordingly, an exposed portion in the positive resist film is removed, and the non-photosensitive black resin film, which is positioned under the removed portion, is selectively removed (S4).

Next, an entire surface including a non-exposed positive resist film is irradiated with exposure light, whereby exposure for an entire surface is performed (S5). Then, the exposed positive resist film is removed by using a second developing solution (S6).

In accordance with Embodiment Mode 1, a black resin can be used as a material of a resin BM in order to improve a contrast of brightness and a contrast of color. In addition, generation of a crack and peeling in the resin BM can be suppressed and deterioration of coverage of a layer formed over the resin BM can be suppressed.

Hereinafter, Embodiment Mode 2 of the present invention will be specifically explained with reference to drawings. FIGS. 2A to 2D and FIGS. 3A to 3D show cross-sectional views showing a method for manufacturing a semiconductor device in Embodiment Mode 2 of the present invention.

Figure 2A:
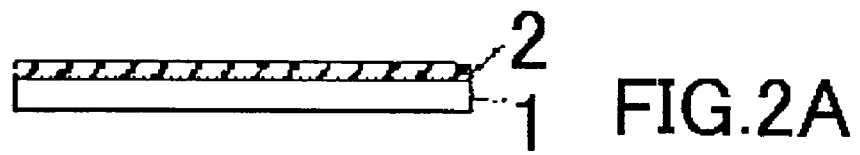
FIGS. 2A to 2D are cross-sectional views for showing a method for manufacturing a semiconductor device in Embodiment Mode 2 of the present invention.

First, as shown in FIG. 2A, a non-photosensitive black polyimide film 2 that is a non-photosensitive black resin is formed over a substrate 1 by a spin coating method. For details, 7 ml of non-photosensitive black polyimide is dropped over the substrate 1, and the substrate 1 is rotated at a rotation rate of 1000 rpm for 20 seconds. Accordingly, the non-photosensitive black polyimide film 2 having a thickness of about 1.5 μm is applied over the substrate. Thereafter, the non-photosensitive black polyimide film 2 is pre-baked at a temperature of about 160° C. for 180 seconds by a hot plate. Although it is not shown here, a transistor is formed over the substrate 1.

Figure 2B:
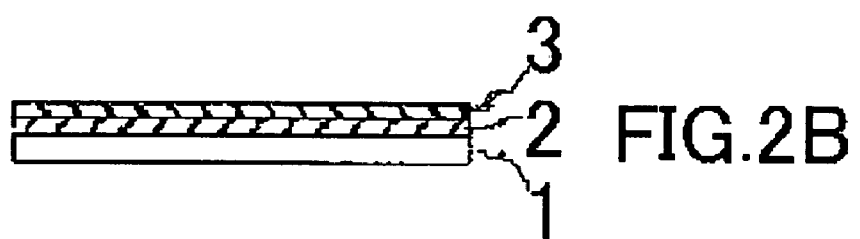

Next, as shown in FIG. 2B, a positive resist film 3 is formed over the non-photosensitive black polyimide film 2 by a spin coating method. For details, a positive resist (TFR-1250 PM manufactured by TOKYO OHKA KOGYO CO., LDT) is dropped over the non-photosensitive black polyimide film 2, and the substrate 1 is rotated at a rotation rate of 950 rpm for 13 seconds. Accordingly, the positive resist film 3 having a film thickness of about 1.5 μm is applied over the non-photosensitive black polyimide film 2. Then, the positive resist film 3 is pre-baked at a temperature of about 115° C. for 90 seconds by a hot plate. A typical example of a positive resist composition including a sensitizer is a diazonaphthoquinone (DNQ)-novolac resin series. A sensitizer is diazonaphthoquinone (DNQ). In addition, a positive resist composition that has chemical amplification may also be used.

Figure 2C:
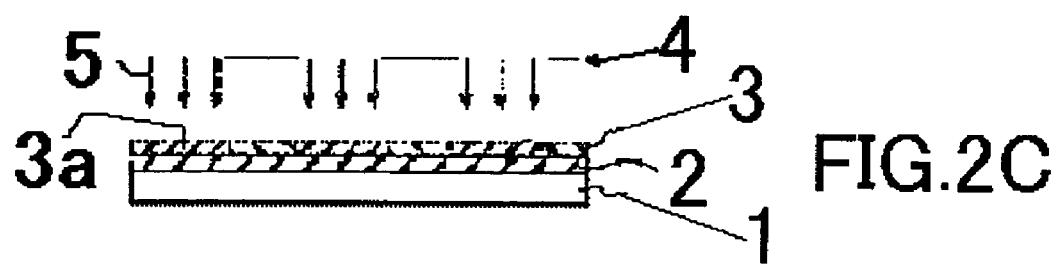

Subsequently, as shown in FIG. 2C, a photo mask 4 is arranged on the upper side of the positive resist film 3, and the positive resist film 3 is irradiated with exposure light 5 through the photo masks 4. Accordingly, a portion 3a in the positive resist film 3, which is irradiated with exposure light, is exposed. An exposure time in this case is 20 seconds.

Figure 2D:
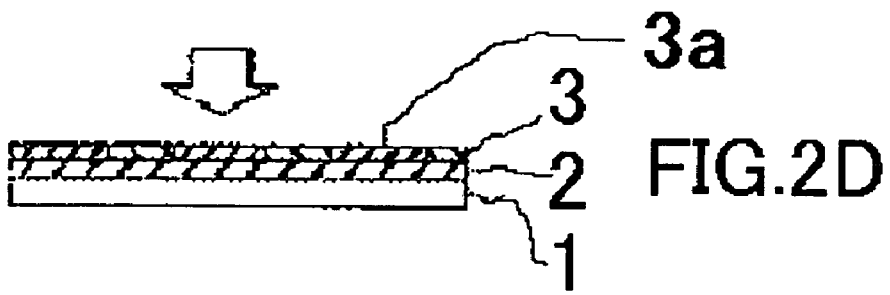

Then, as shown in FIG. 2D, the positive resist film 3 is developed by paddle development using a developing solution (NMD3 aqueous solution including TMAH of 2.38% manufactured by TOKYO OHKA KOGYO CO., LDT), and the non-photosensitive black polyimide film 2 is etched.

Accordingly, the exposed portion 3a in the positive resist film 3 is removed, and a non-photosensitive black polyimide film that is positioned under the exposed portions 3a is removed. This development and etching are performed for 120 seconds. It is to be noted that the non-photosensitive black polyimide film can be etched by the developing solution.

Figure 3A:
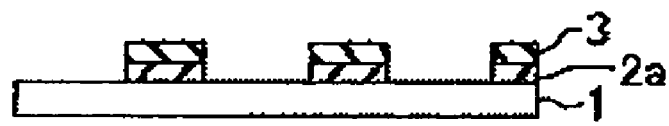
FIGS. 3A to 3D are cross-sectional views for showing a method for manufacturing a semiconductor device in Embodiment Mode 2 of the present invention.

Next, the substrate 1 is cleaned by rinse with pure water for 30 seconds. After development, etching, and, cleaning, a state as shown in FIG. 3A is obtained. In other words, a resin BM layer 2a made of the non-photosensitive black polyimide is formed over the substrate 1, and the positive resist film 3 remains over the resin BM layer 2a.

Figure 3B:
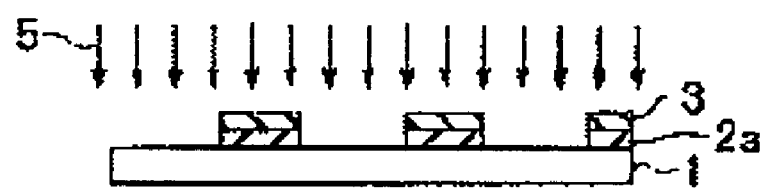

Then, as shown in FIG. 3B, in order to expose the remaining positive resist film 3, an entire surface including the positive resist film 3 is irradiated with the exposure light 5, whereby exposure for an entire surface is performed. An exposure time in this case is for 40 seconds.

Figure 3C:
Figure 3D:
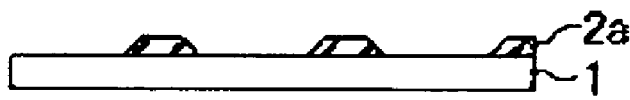

Subsequently, as shown in FIG. 3C, the positive resist film 3 that is exposed by using a developing solution (NMD3 aqueous solution including TMAH of 2.38% manufactured by TOKYO OHKA KOGYO CO., LDT) is removed. In this point, since only the resist film is removed, a processing time may be short. The resin BM layer is also dissolved by the developing solution; however, only the resist film is removed by using a difference of a solution rate (an etching rate) of the positive resist film after development and the non-photosensitive black polyimide film. Specifically, a time for dissolving the positive resist film 3 by the developing solution is about 30 seconds, and a time for cleaning with pure water is about 30 seconds. After removing the resist film, a state as shown in FIG. 3D is obtained. For details, the resin BM layer 2a made of the non-photosensitive black polyimide is formed over the substrate 1. This resin BM layer 2a is subjected to a small amount of wet etching by using the developing solution in removing the resist film. Therefore, a taper angle of a cross-section of the resin BM layer 2a is reduced, and a cross-sectional shape becomes smooth. Accordingly, a cross-sectional taper angle, which is suitable for a partition layer dividing a pixel of an organic electroluminescent element, can be obtained. Since an aqueous solution of TMAH (tetramethylammonium hydroxide) is used as the developing solution as described above, the resin BM layer is hardly damaged. Thereafter, the resin BM layer 2a is baked at a temperature of 250° C. for 1 hour by using an oven.

According to Embodiment Mode 2, after the non-photosensitive black polyimide film 2 is patterned, an entire surface of the positive resist film 3 is exposed, and the exposed positive resist film 3 is removed by the developing solution. Therefore, generation of a crack and peeling in the resin BM layer 2a, as a case of removing the resist by using an organic solvent, can be suppressed, and a taper angle of a cross-section of the resin BM layer 2a can be reduced.

Since the resist film is removed by using the developing solution in this embodiment mode, a large amount of resist peeling solutions and organic solvents is not necessary to be used as compared to a conventional example. Accordingly, by using a developing solution that is an aqueous solution, a physical burden to a worker and damage to environment can be reduced.

Further, since the non-photosensitive black polyimide film is exposed twice to the developing solution in the step shown in FIG. 2D and the step shown in FIG. 3C in this embodiment mode, generation of a residue over the substrate can be suppressed. For example, even if the non-photosensitive black polyimide film remains slightly as a residue over the substrate in the step shown in FIG. 2D, the slightly remaining residue can be completely dissolved by being exposed to the developing solution for the second time in the step shown in FIG. 3C.

This embodiment mode can be implemented by using a general coating applicator, exposure apparatus, and development apparatus; therefore, this embodiment mode has an advantage that a special apparatus, for example, a resist peeling apparatus, is not necessary.

In Embodiment Mode 2, the developing solutions in the step (development of the resist film and etching of the non-photosensitive black polyimide film) shown in FIG. 2D and the step (removal of the resist film) shown in FIG. 3C are an aqueous solution including TMAH of 2.38%. Further, both steps are performed by using the developing solutions having the same concentration and for the different processing time of 120 seconds and 30 seconds, respectively. However, the concentration of the developing solution in both steps can be changed in a range of 0.24% to 5.0%. For example, the treatment of the step shown in FIG. 2D can be performed by using a developing solution having a higher concentration than the aqueous solution of 2.38% for shorter time than 120 seconds (for example, 30 seconds), and treatment of the step shown in FIG. 3C can be performed by using a developing solution having a concentration of 2.38% for 30 seconds. Accordingly, an entire processing time can be shortened. That is, a developing solution used in the step shown in FIG. 2D is set to have a high concentration and a developing solution used in the step shown in FIG. 3C is set to have a low concentration, whereby an entire processing time can be shortened.

Next, an experiment is performed for confirming that a taper angle of a cross-section of a resin BM layer can be reduced. An experimental method and an experimental result will be explained.

(Experimental Method)

A non-photosensitive black polyimide film having a target film thickness of 1.5 μm is formed over a substrate. This non-photosensitive black polyimide film is pre-baked at a temperature of 160° C. for 180 seconds. Subsequently, a positive resist film having a target film thickness of 1.5 μm is applied over the non-photosensitive black polyimide film, and this positive resist film is pre-baked at a temperature of 90° C. Then, the resist film is exposed for 20 seconds. The positive resist film is developed by the similar developing solution to Embodiment Mode 2 for 120 seconds and the non-photosensitive black polyimide film is etched, whereby a resin BM layer is formed. Subsequently, the substrate is cleaned with pure water for 30 second. An entire surface of a non-exposed positive resist film that remains is exposed for 40 seconds, and the positive resist film is developed by the similar developing solution to Embodiment Mode 2 for 30 seconds and removed. Then, the substrate is cleaned with pure water for 30 seconds, and the resin BM layer is baked at a temperature of 250° C. for 1 hour.

(Experimental Result)

Figure 4:
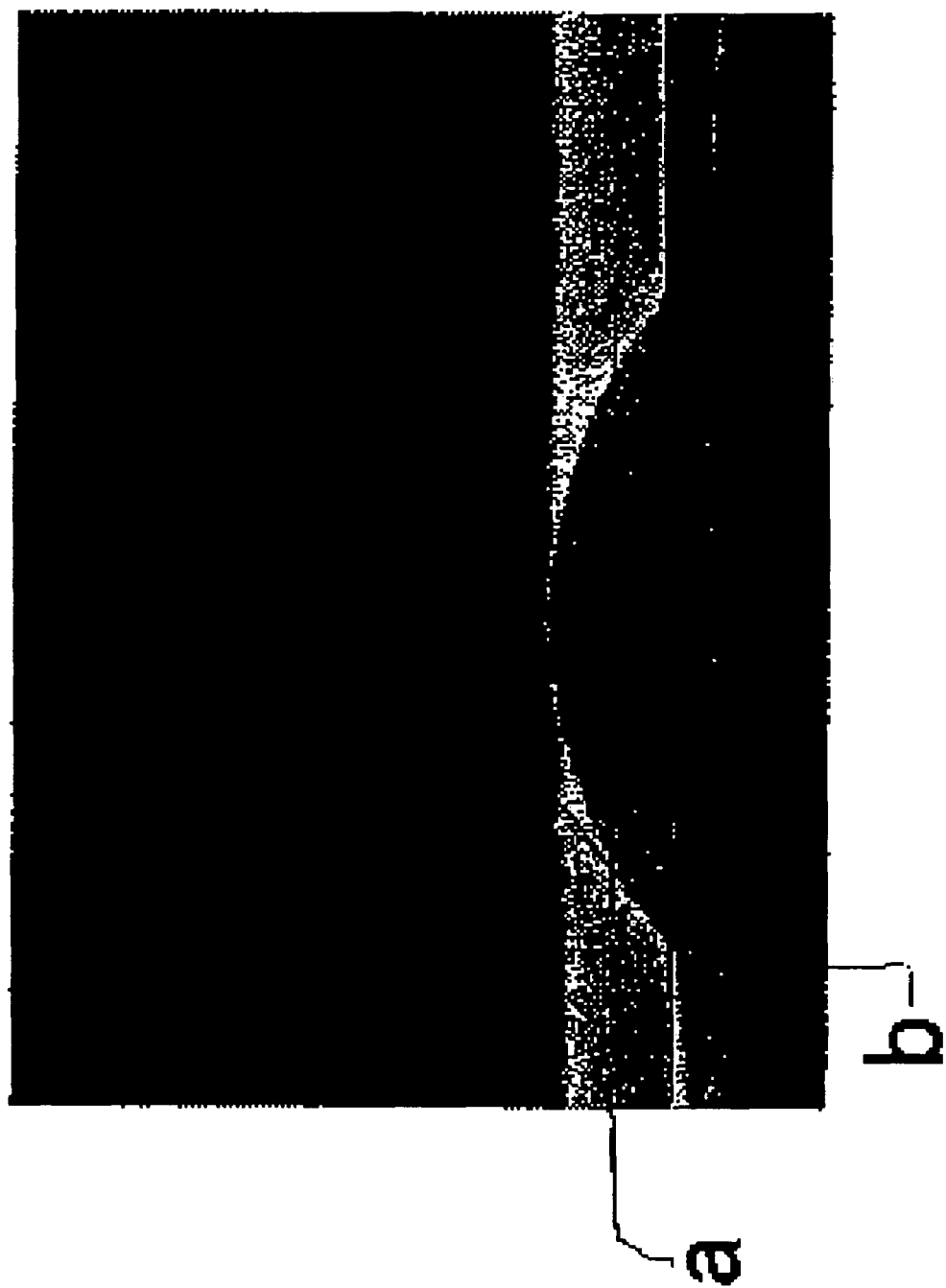
FIG. 4 is a photograph for showing a cross-section of a resin BM layer that is obtained by an experiment.

FIG. 4 shows a photograph showing a cross-section of the resin BM layer that is obtained by the above experiment. The resin BM layer shown in FIG. 4 has a film thickness of 1.2 μm and a taper angle of 33°. This taper angle is measured by the following method: a straight line that is parallel to a bottom face of the resin BM layer shown in FIG. 4 is drawn from a position where a distance between a top part and the bottom face of the resin BM layer is divided into half; and another straight line is drawn, which connects a point "a" where the straight line parallel to the bottom face is intersected with a surface of the resin BM layer, and a circumference "b"

between the bottom face and the resin BM layer. An angle that is obtained by this straight line and the bottom face is measured.

Next, a comparative experiment is performed for confirming that a taper angle of a cross-section of a resin BM layer is increased as compared to that of Embodiment Mode 2 in a case where a resist film is removed by butyl acetate that is an organic solvent. A comparative experimental method and a comparative experimental result will be explained.

(Comparative Experimental Method)

A non-photosensitive black polyimide film having a target film thickness of 1.5 μm is formed over a substrate. This non-photosensitive black polyimide film is pre-baked at a temperature of 120° C. for 180 seconds. Subsequently, a positive resist film having a target film thickness of 1.5 μm is applied over the non-photosensitive black polyimide film, and this positive resist film is pre-baked at a temperature of 90° C. Then, the resist film is exposed for 20 seconds. The positive resist film is developed by the similar developing solution to Embodiment Mode 2 for 60 seconds, and the non-photosensitive black polyimide film is etched, whereby a resin BM layer is formed. Subsequently, the substrate is cleaned with pure water for 30 seconds. A non-exposed positive resist film that remains is removed by butyl acetate, and the resin BM layer is baked at a temperature of 250° C. for 1 hour.

(Comparative Experimental Result)

Figure 5:
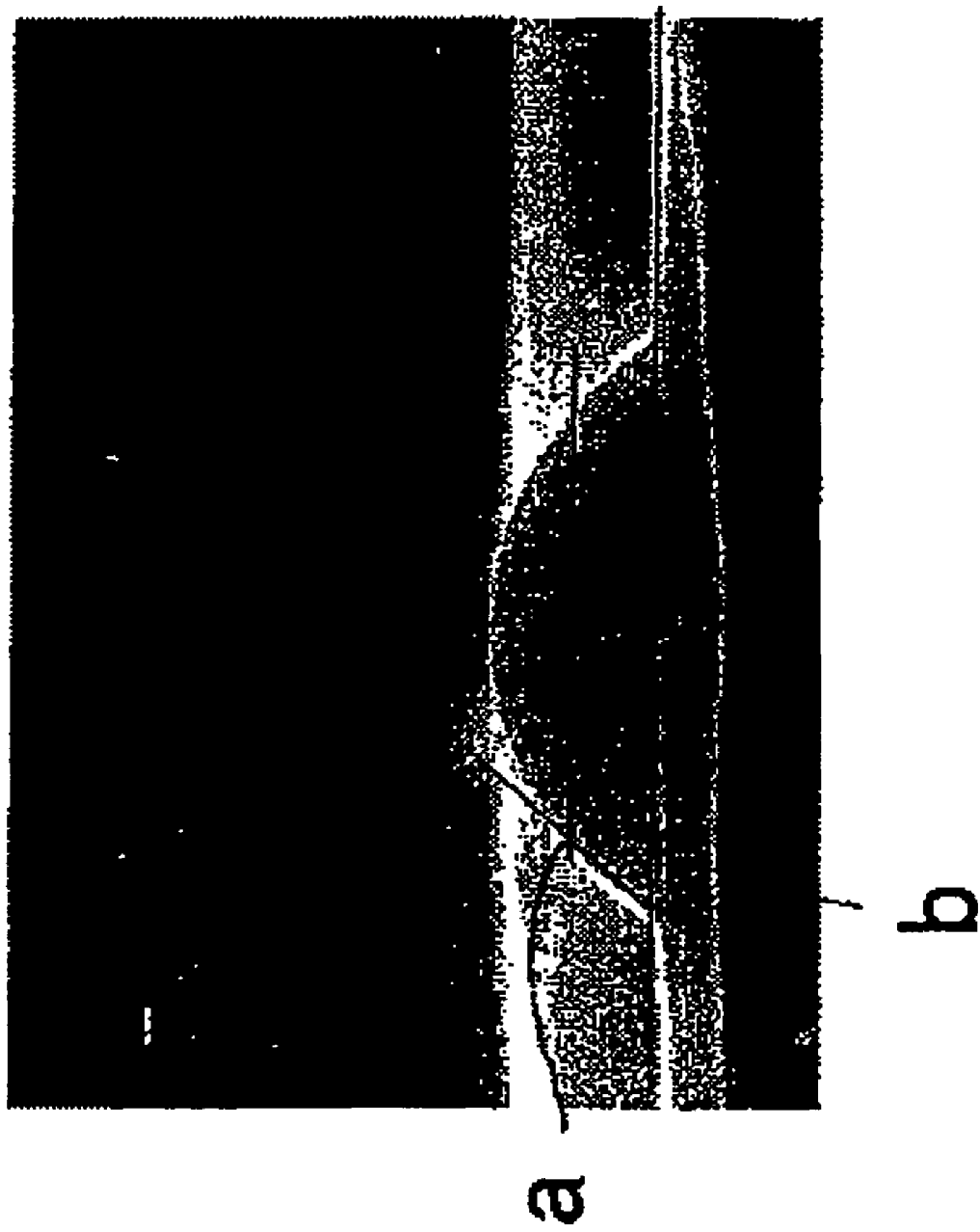
FIG. 5 is a photograph for showing a cross-section of a resin BM layer that is obtained by a comparative experiment.

FIG. 5 shows a photograph for showing a cross-section of the resin BM layer that is obtained by the above comparative experiment. The resin BM layer shown in FIG. 5 has a film thickness of 1.6 μm and a taper angle of 48°. This taper angle is measured by the following method: a straight line that is parallel to a bottom face of the resin BM layer shown in FIG. 5 is drawn from a position where a distance between a top part and the bottom face of the resin BM layer is divided into half; and another straight line is drawn, which connects a point "a" where the straight line parallel to the bottom face is intersect with a surface of the resin BM layer, and a circumference "b" between the bottom face and the resin BM layer. An angle that is obtained by this straight line and the bottom face is measured.

According to the above experiment and comparative experiment, it is confirmed that, in the case where a resin BM layer is manufactured by the method for manufacturing a semiconductor device in Embodiment Mode 2, a taper angle of a cross-section of the resin BM layer can be reduced as compared to the case where a resist is removed by using butyl acetate. Since the taper angle is reduced, coverage of a layer formed over the resin BM is improved.

In the present embodiment mode, the case where a resin BM layer is manufactured by using a non-photosensitive black resin is described; however, the present invention is not limited thereto. A resin film may be manufactured by using a non-photosensitive resin. In a case of pigment, the non-photosensitive resin may be colored with color other than black. Alternatively, the non-photosensitive resin may not be colored.

Embodiment 1

FIGS. 6A to 6E show cross-sectional views for showing a method for manufacturing a semiconductor device in accordance with Embodiment 1 of the present invention.

Figure 6:
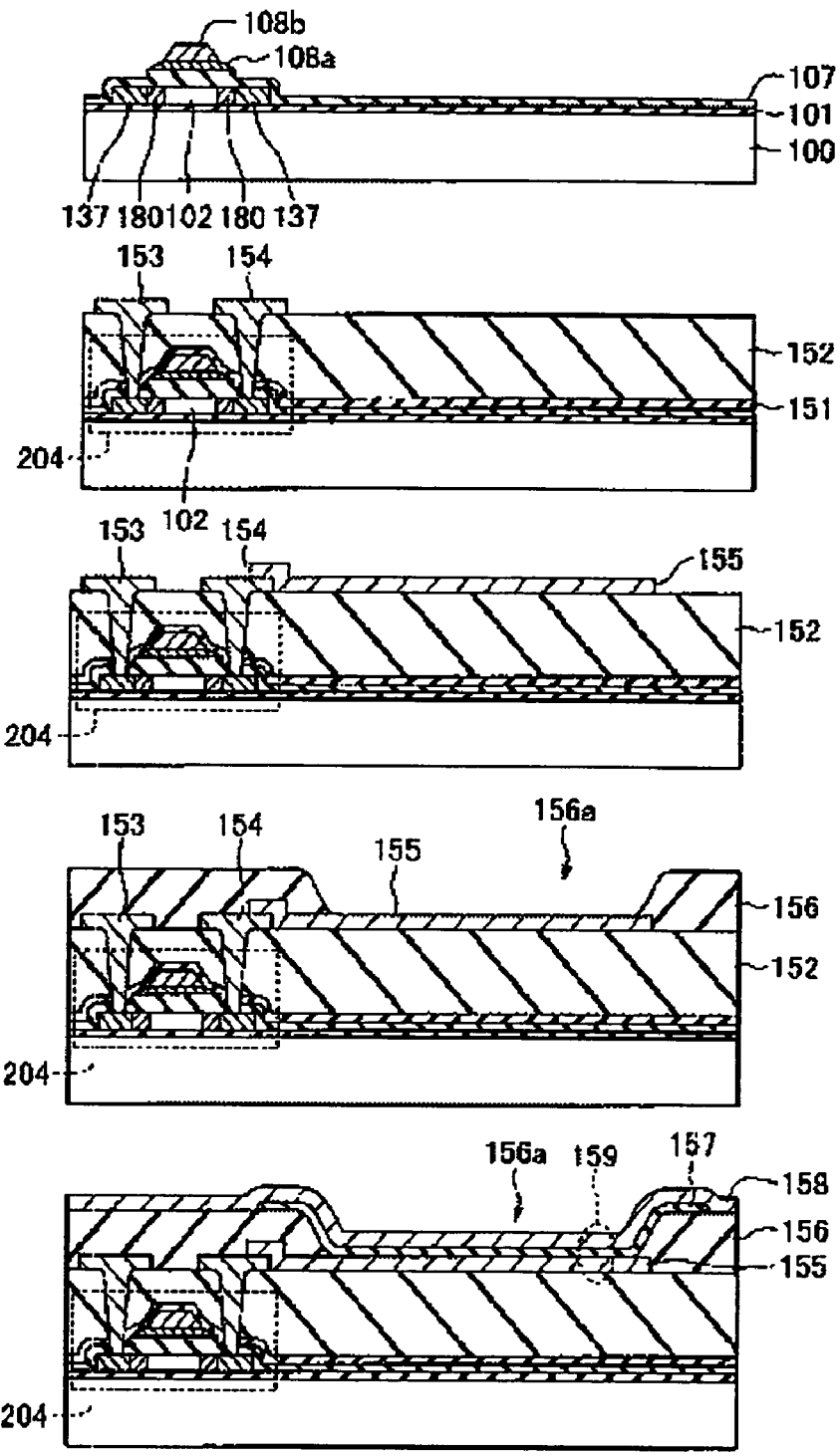
FIGS. 6A to 6E are cross-sectional views for showing a method for manufacturing a semiconductor device in Embodiment 1 of the present invention.

First, as shown in FIG. 6A, a base insulating film 101 is formed over a substrate 100. Here, as the substrate 100, a glass substrate, a quartz substrate, a ceramic substrate, or the like can be used. Further, as the substrate, an insulting film may be formed on a surface of a silicon substrate, a metal substrate, or a stainless substrate. Furthermore, a plastic substrate that can thermally withstand a processing temperature in all of the following steps.

The base insulating film 101 is provided to prevent an element (for example, an alkali metal) contained in the substrate 100 from being dispersed into a semiconductor film formed in the upper layer of the substrate 100. As the base insulating film 101, an insulating film such as a silicon oxide film, a silicon nitride film, or a silicon oxynitride film ($SiO_xN_y$) is used. For example, an insulating film in which a first layer and a second layer are stacked as described below is illustrated. The first layer is a first silicon oxynitride film that is formed using $SiH_4$, $NH_3$, and $N_2O$ as a reactive gas, and the first layer has a thickness of 50 to 100 nm. The second layer is a second silicon oxynitride film that is formed using $SiH_4$ and $N_2O$ as a reactive gas, and the second layer has a thickness of 100 to 150 nm. Alternatively, the base insulating film 101 may have a single-layer structure. In this case, as the base insulating film 101, a silicon nitride film (SiN film) or a second silicon oxynitride film ($SiO_xN_y$ (X>Y)) that is formed by the above process is preferably used. When gettering is performed, a metal element (for example, nickel) tends to be moved to a region having a high oxide concentration. Therefore, a silicon nitride film is preferably used as the base insulating film 101. Furthermore, an insulating film having a three-layer structure in which a first silicon oxynitride film, a second silicon oxynitride film, and a silicon nitride film are sequentially stacked, may be used as the base insulating film 101.

Subsequently, a semiconductor film having an amorphous structure (hereinafter, referred to as an amorphous semiconductor film) is formed over the base insulating film 101 by a sputtering method, for example. The amorphous semiconductor film is formed of a semiconductor material containing silicon as its main component. For example, an amorphous silicon film, an amorphous silicon germanium film, or the like is adopted to the amorphous semiconductor film, which is formed to have a thickness of 10 to 100 nm by a plasma CVD method, a low pressure CVD method or a sputtering method. In order to obtain an amorphous semiconductor film having a superior crystalline structure in the subsequent crystallization step, the amorphous semiconductor film is preferably set to contain impurities such as oxygen and nitrogen, of which a concentration is preferably reduced to $5 \times 10^{18}/cm^3$ (an atomic concentration measured by secondary ion mass spectrometry (SIMS)) or less. Such impurities become the factor obstructive to the subsequent crystallization, and also become the factor of the increase in density of a trapping center or a recombination center even after the crystallization. Therefore, it is preferable to use, not only a material gas of high purity, but also an ultra-high vacuum CVD apparatus having a reaction chamber that is processed with mirror surface treatment (electric field polishing treatment) and an oil-free type vacuum evacuation system.

Then, the amorphous semiconductor film is crystallized. Here, a technique disclosed in Japanese Patent Application Laid-Open No. H8-78329 is used. By the technique disclosed in the bulletin, a crystalline semiconductor film is formed by selectively adding a metal element that promotes crystallization with respect to an amorphous silicon film and crystallizing the amorphous silicon film while performing heat treatment to make an addition region a starting point. For this heat treatment, heat treatment by an electric furnace or irradiation of intense light may be used. Heat treatment by an electric furnace may be performed, for example, at a temperature of 500 to 650° C. for about 4 to 24 hours. Here, after heat treatment for dehydrogenation (at 500° C., for 1 hour), heat treatment for crystallization (at 550° C. for 4 hours) is performed to obtain a crystalline semiconductor film. It is to be noted that heat treatment may be performed by using a lamp annealing apparatus instead of an electric furnace.

In order to increase a crystallization rate in the crystalline semiconductor film and repair defects that remains in crystal grains, irradiation of laser light (XeCl: wavelength of 308 nm) is performed in the atmosphere or the oxygen atmosphere. As the laser light, excimer laser light with a wavelength of 400 nm or less; or second harmonic wave or third harmonic wave of a YAG laser is used. In either case, pulse laser light with a repetition frequency of about 10 to 1000 Hz is used, the pulse laser light is condensed to 100 to 500 mJ/cm$^2$ by an optical system, and irradiation is performed with an overlap ratio of 90 to 95%, whereby a surface of the silicon film may be scanned. Here, irradiation of laser light is performed in the atmosphere with a repetition frequency of 30 Hz and energy density of 410 mJ/cm$^2$.

An amorphous semiconductor film containing an argon element to be a gettering site is formed to have a film thickness of 150 nm over a barrier layer by a sputtering method. The amorphous semiconductor film here is formed under a condition that a pressure in a chamber is 0.3 Pa, a flow rate of gas (Ar) is 50 (sccm), the formation power is 3 kW, and a temperature of the substrate is 150° C. It is to be that an atomic concentration of an argon element contained in the amorphous semiconductor film under the above condition is $3 \times 10^{20}/cm^3$ to $5 \times 10^{20}/cm^3$, and an atomic concentration of oxygen is $1 \times 10^{19}/cm^3$ to $3 \times 10^{19}/cm^3$. Thereafter, heat treatment using a lamp annealing apparatus is performed at a temperature of 650° C. for 3 minutes to perform gettering of metal atoms in the crystalline semiconductor film to the amorphous semiconductor film. After the amorphous semiconductor film containing argon, which acts as a gettering site, is selectively removed by etching using the barrier layer as an etching stopper, the barrier layer is selectively removed with dilute hydrofluoric acid.

A thin oxide film is formed using ozone water on a surface of the crystalline semiconductor film. Then, a mask made of a resist is formed, and the crystalline semiconductor film is etched into a desired shape by using this mask to form a crystalline semiconductor film 102 having an island-shape, which is separated. After forming the crystalline semiconductor film, the mask is removed.

It is to be noted that a p-type impurity element or an n-type impurity element may be added to the crystalline semiconductor film 102 in order to control a threshold value (Vth) of a TFT after forming the crystalline semiconductor film 102. The p-type impurity element refers to, for example, an element belonging to group 13 of the periodic table such as boron (B), aluminum (Al), or gallium (Ga). The n-type impurity element refers to, for example, an element belonging to group 15 of the periodic table such as phosphorous (P) or arsenic (As).

A surface of the crystalline semiconductor film 102 is cleaned at the same time as removing the oxide film with an etchant containing hydrofluoric acid. Thereafter, a gate insulating film 107 is formed. In this embodiment, a silicon oxynitride film (composition ratio of Si=32%, O=59%, N=7%, and H=2%) having a film thickness of 115 nm, which is formed by a plasma CVD method, is used as the gate insulating film 107.

A first conductive film 108a made of a TaN film having a film thickness of 30 nm and a second conductive film 108b made of a W film having a film thickness of 370 nm are stacked over the gate insulating film 107 to form a conductive layer that is to be a gate electrode. The TaN film is formed by sputtering a Ta target in an atmosphere containing nitrogen. The W film is formed by sputtering a W target. An alloy film of W and Mo may be used instead of the W film.

As a conductive material for forming the first conductive film 108a and the second conductive film 108b, an element selected from Ta, Ti, Mo, Al, and Cu; or an alloy material or a compound material containing the elements as its main component can be used other than the above material. Further, the conductive film that is to be the gate electrode is not limited to a two-layer structure. A three-layer structure, for example, may be employed. Furthermore, as the conductive layer that is to be the gate electrode, a semiconductor film of a single layer, which is typified by a polycrystalline silicon film doped with an impurity element such as phosphorous, may be used.

Next, a resist film is applied over the second conductive film 108b, and the resist film is exposed and developed whereby, a resist pattern is formed over the second conductive film 108b. Then, first etching treatment for forming the gate electrode and a wiring is performed by dry etching with the use of the resist pattern. ICP (Inductively Coupled Plasma) is preferably used as plasma for etching in this first etching treatment. In this case, the conductive film can be etched so as to have a desired taper shape by appropriately adjusting an etching condition (the amount of power applied to a coiled electrode, the amount of power applied to an electrode on the substrate side, an temperature of the electrode on the substrate side, and the like). As an etching gas, a chlorinated gas such as $Cl_2$, $BCl_3$, $SiCl_4$, and $CCl_4$, a fluorinated gas such as $CF_4$, $SF_6$, and $NF_3$, or $O_2$ may be appropriately employed.

Through the first etching treatment, second etching is subsequently performed after performing the first etching, for example.

In the first etching, $CF_4$, $Cl_2$, and $O_2$ are used as etching gases, and the flow rate of each of the gases is 25/25/10 (sccm). Under such a condition, an RF (13.56 MHz) power of 500 W is applied to the coiled electrode at a pressure of 1 Pa to generate plasma. The substrate side (sample stage) also receives an RF (13.56 MHz) power of 150 W to be applied with a substantially negative self-bias voltage. Under the first etching condition, for example, the etching rate of the W film is 200.39 nm/min, and the etching rate of the TaN film is 80.32 nm/min. The selection ratio of the W film to the TaN film is, for example, about 2.5. The W film is tapered under the first etching condition at an angle of about 26°.

Subsequently, the etching condition is changed, and the second etching is performed. In the second etching, $CF_4$ and $Cl_2$ are used as etching gases, and the flow rate of each of the gases is 30/30 (sccm). Under such a condition, an RF (13.56 MHz) power of 500 W is applied to the coiled electrode at a pressure of 1 Pa to generate plasma, and etching is performed for about 30 seconds. The substrate side (sample stage) also receives an RF (13.56 MHz) power of 20 W to be applied with a substantially negative self-bias voltage. Under the second etching condition using a mixture of $CF_4$ and $Cl_2$, the TaN film and the W film are etched to almost the same degree. The etching rate of the W film is 58.97 nm/min, and the etching rate of the TaN film is 66.43 nm/min under the second etching condition.

In the first etching treatment, the first conductive film 108a and the second conductive film 108b are made to have edge portions with an appropriate taper shape by forming the resist mask into a proper shape and by applying the bias voltage to the substrate side. The angle of the tapered portions may be set to 15 to 45° under the above condition.

Subsequently, second etching treatment is performed without removing the resist pattern. Here, $SF_6$, $Cl_2$ and $O_2$ are used as etching gases, the flow rate of the each gases is set to be 24/12/24 (sccm). Under such a condition, an RF (13.56 MHz) power of 700 W is applied to the coiled electrode at a pressure of 1.3 Pa to generate plasma. The etching is performed for 25 seconds by using this plasma, for example. The substrate side (sample stage) also receives an RF (13.56 MHz) power of 10 W to be applied with a substantially negative self-bias voltage. In the second etching treatment, the etching rate of the W film is 227.3 nm/min, the etching rate of the TaN film is 32.1 nm/min, and the selection ratio of the W film to the TaN film is 7.1. The etching rate to the silicon oxynitride film (SiON) film that is the gate insulating film is 33.7 nm/min, and the selection ratio of the W film to the silicon oxynitride film is 6.83. By this second etching treatment, a taper angle of the W film is, for example, 70°. In such a manner, the gate electrode made of the first conductive film 108a and the second conductive film 108b is formed.

Next, doping treatment is performed to form an impurity region in the crystalline semiconductor film 102. The doping treatment may be performed by a plasma doping method or an ion implanting method. In a case of performing an ion implanting method, an accelerating voltage is set to be 60 to 100 kV as an ion implanting condition.

In the crystalline semiconductor film 102 at this time, a region where only the first conductive film 108a is provided in the upper side of the crystalline semiconductor film 102 and a region where both of the first conductive film 108a and the second conductive film 108b are not provided in the upper side of the crystalline semiconductor film 102 are provided. However, amount of dose in each region is different because a film thickness of an upper layer has a difference. Thus, in the crystalline semiconductor film 102, two low concentration impurity regions 180 are formed in regions where only the first conductive film 108a is provided in the upper side, as well as high concentration impurity regions 137 that are adjacent to the outer side of each low concentration impurity region 180 being provided.

It is to be noted that the crystalline semiconductor film in a pixel portion becomes a semiconductor layer for forming a storage capacitor (not shown).

Through the above steps, the impurity regions are formed in the crystalline semiconductor film 102. Further, the first conductive film 108a and the second conductive film 108b become the gate electrode, which is to be one of electrodes for forming a storage capacitor in the pixel portion.

Subsequently, an insulating film to cover an almost entire surface (not shown) is formed. In this embodiment, a silicon oxide film having a film thickness of 50 nm is formed by a plasma CVD method. As a matter of course, this insulating film is not limited to the silicon oxide film. An insulating film containing other silicon, which has a single-layer structure or a stacked-layer structure, may be used.

Then, a step of activating the impurity elements added to the crystalline semiconductor film 102 is performed. This activation step is performed by rapid thermal annealing (RTA) using a lamp light source, irradiation of a YAG laser or an excimer laser from the back surface, or heat treatment using a furnace; or by combining a plurality of them.

By the above activation treatment, the impurity elements are activated at the same time as the metal element, which is used as a catalyst in crystallizing the crystalline semiconductor film 102, is gettered in the high concentration impurity regions 137, and a nickel concentration in mainly a region to be a channel formation region of the crystalline semiconductor film 102 is reduced. As a result, crystallinity of the channel formation region is improved, and an off-current value of a TFT (a thin film transistor) 204 is reduced. In addition, since the crystallinity is improved, high electron field-effect mobility can be obtained. Therefore, a TFT 204 having such favorable characteristics can be obtained (FIG. 6B).

As shown in FIG. 6B, a first interlayer insulating film 151 made of a silicon nitride film is formed. Heat treatment (at a temperature of 300 to 550° C. for 1 to 12 hours) is performed to perform a step of hydrogenating the crystalline semiconductor film 102. This step is a step of terminating dangling bonds of the crystalline semiconductor film 102 by hydrogen contained in the first interlayer insulating film 151. The crystalline semiconductor film 102 can be hydrogenated independently of an insulating film (not shown) made of the silicon oxide film. As another means of hydrogenation, plasma hydrogenation (hydrogenation treatment by excited hydrogen by plasma) may be performed.

A second interlayer insulating film 152 is formed over the first interlayer insulating film 151. The second interlayer insulating film 152 may be made of an organic insulating material or an inorganic insulating material. In this embodiment, an inorganic siloxane based insulating material made of silicon, oxygen, and hydrogen, which is formed using a siloxane material as a starting material, is used. Alternatively, an organic siloxane based insulating material is also used. In the organic siloxane based insulating material, hydrogen that is combined with silicon, which is one of the inorganic siloxane based insulating material, is substituted with an organic group such as methyl or phenyl. It is to be noted that an acryl resin film with a film thickness of 1.6 μm may be used.

Then, a resist pattern is formed over the second interlayer insulating film 152. The second interlayer insulating film 152 and the first interlayer insulating film 151 are etched by using the resist pattern as a mask to form contact holes positioned on the high concentration impurity regions 137. In this embodiment, a plurality of etching treatment is sequentially performed. In other words, after the second interlayer insulating film is etched by using the first interlayer insulating film as an etching stopper, the first interlayer insulating film is etched by using the insulating film that is not shown as an etching stopper. Then, the insulating film that is not shown is etched.

A metal film (for example, Al, Ti, Mo, or W) is formed over an entire surface of the second interlayer insulating film 152 and in each contact holes, and the metal film is patterned to form a wiring and a pixel electrode. It is to be noted that a film, which has superiority in reflectivity, such as a film containing Al or Ag as its main component, or a stacked film thereof is desirably used as a material of a wiring and a pixel electrode. Thus, a source wiring 153 and a drain wiring 154 are formed.

Next, as shown in FIG. 6C, a lower electrode (a reflective electrode) 155 is formed over the drain electrode 154 and the second interlayer insulating film 152.

As shown in FIG. 6D, a resin BM layer 156 is formed over the lower electrode 155, the source wiring, the drain wiring, and the second interlayer insulating film 152 by the similar method to Embodiment Mode 2.

For details, a non-photosensitive black polyimide film is applied over an entire surface including the lower electrode 155, and this non-photosensitive black polyimide film is pre-baked. Then, a positive resist film (not shown) is applied over the non-photosensitive black polyimide film, and this positive resist film is pre-baked. Subsequently, the positive resist film is exposed. This exposed positive resist film is developed by paddle development using a developing solution (NMD3 aqueous solution including TMAH of 2.38% manufactured by TOKYO OHKA KOGYO CO., LDT), and the non-photosensitive black polyimide film is etched. Accordingly, the exposed portion in the positive resist film is removed, and the non-photosensitive black polyimide film that is positioned under the exposed portion is removed. As a result, the resin BM layer 156 made of non-photosensitive black polyimide is formed, which has a BM opening portion 156a that is positioned over the lower electrode 155. The positive resist film remains over the resin BM layer 156. Subsequently, cleaning with pure water is performed for 30 seconds. Thereafter, in order to expose the remaining resist film, an entire surface including the resist film is irradiated with exposure light, whereby the entire surface is exposed. Then, the positive resist film that is exposed by using a developing solution (NMD3 aqueous solution including TMAH of 2.38% manufactured by TOKYO OHKA KOGYO CO., LDT) is removed. In such a manner, the resin BM layer 156 made of the non-photosensitive black polyimide is formed. A small amount of wet etching is performed with the developing solution in removing the resist film; therefore, a taper angle of a cross-section of the BM opening portion 156a in the resin BM layer 156 is reduced, and a shape of the cross-section becomes smoothed similarly to Embodiment Mode 2. Accordingly, a cross-section taper angle can be obtained, which is suitable for a partition layer dividing a pixel of an organic electroluminescent element. Since an aqueous solution of TMAH (tetramethylammonium hydroxide) is used as the developing solution as described above, the resin BM layer 156 is hardly damaged. Thereafter, the resin BM layer 156 is baked at a temperature 250° C. for 1 hour by using an oven.

As shown in FIG. 6E, an organic light emitting layer 157 is formed in the BM opening portion 156a and over the resin BM layer 156. This organic light emitting layer 157 includes an organic compound (an organic light emitting material) that emits light by adding an electric field. An upper electrode 158 made of a transparent conductive film is formed over the organic light emitting element 157 and the resin BM layer 156. In such a manner, a light emitting element 159 including the upper electrode 158, the organic light emitting layer 157, and the lower electrode 155 is formed in the BM opening portion 156a in the resin BM layer.

In Embodiment 1, the similar effect as that of Embodiment Mode 2 can be obtained. Further, the similar modification example as that of Embodiment Mode 2 can be implemented. In other words, generation of a crack and peeling in the resin BM layer 156 can be suppressed, and a taper angle of a cross-section of the resin BM layer can be reduced. By using a developing solution that is an aqueous solution in forming the resin BM layer, a physical burden to a worker and damage to environment can be reduced. Further, since the non-photosensitive black polyimide film is exposed to the first developing solution and the second developing solution, in other words, the non-photosensitive black polyimide film is twice etched, generation of a residue of the non-photosensitive black polyimide film over the lower electrode 155 can be suppressed. In addition, development of the resist film and etching of the non-photosensitive black polyimide film can be implemented by adjusting the developing solution to have a high concentration, and removing the resist film can be implemented by adjusting the developing solution to have a low concentration.

Embodiment 2

Figure 7:
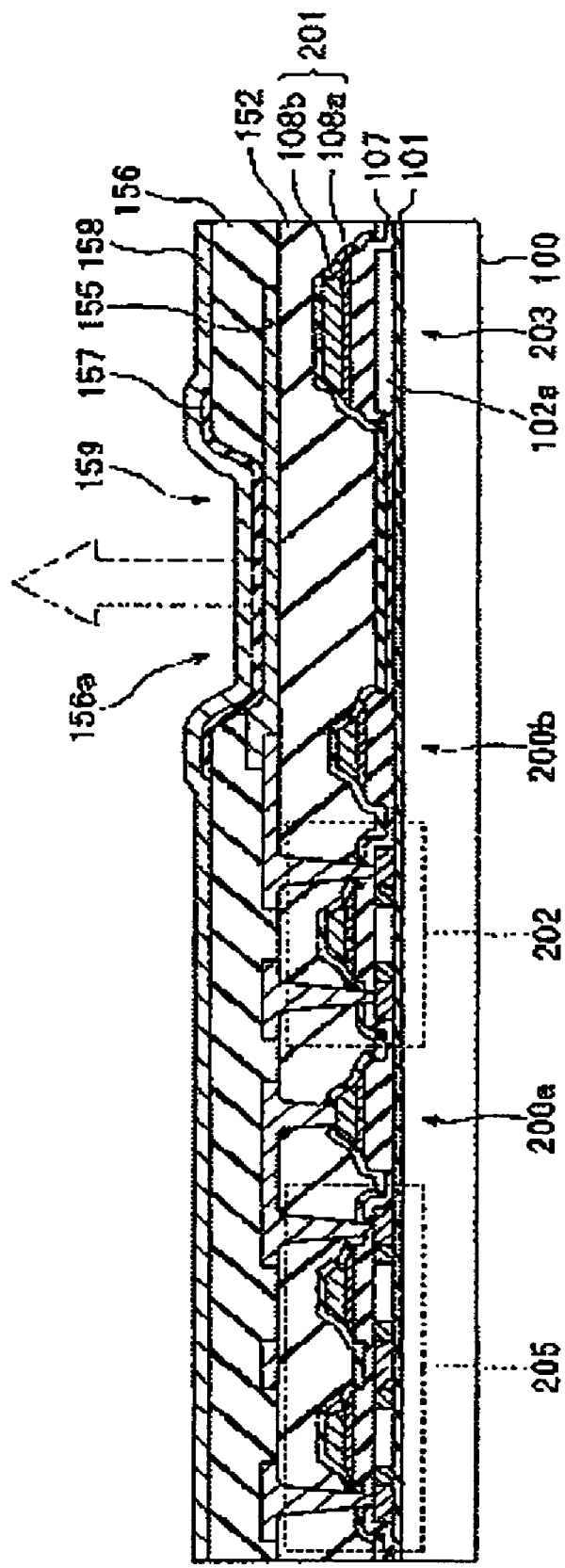
FIG. 7 is a cross-sectional view for explaining a method for manufacturing a semiconductor device in Embodiment 2 of the present invention.

FIG. 7 shows a cross-sectional view for explaining a method for manufacturing a semiconductor device in according with Embodiment 2 of the present invention. The same portion as FIGS. 6A to 6E are denoted by the same reference numeral, and only different portions will be explained. This semiconductor device is an EL light emitting device manufactured by using a resin BM as a partition.

A first TFT 205 and a second TFT 202 are formed over a base insulating film 101. Each of the first TFT 205 and the second TFT 202 is manufactured by the same steps as that of the TFT 204 in Embodiment 1.

A capacitor element 203 including a lower electrode 102a, a gate insulating film 107, and an upper electrode 201 is formed over the base insulating film 101. This capacitor element 203 is manufactured in the steps of forming the TFT 204 in Embodiment 1. In other words, the lower electrode 102a of the capacitor element is manufactured in the step of forming the crystalline semiconductor film 102, the gate insulating film 107 is manufactured in the step of forming the gate insulating film in Embodiment 1, and the upper electrode 201 is manufactured in the step of forming the first conductive film 108a and the second conductive film 108b in Embodiment 1. The upper electrode 201 is constituted by the first conductive film 108a and the second conductive film 108b.

Wiring layers 200a and 200b are formed over the base insulating film 101 with the gate insulating film 107 interposed therebetween. The wiring layers 200a and 200b are manufactured in the step of forming the first conductive film 108a and the second conductive film 108b in Embodiment 1. The wiring layers 200a and 200b are constituted by the first conductive film 108a and the second conductive film 108b.

A source wiring or a drain wiring of the first TFT 205 is connected to the wiring layer 200a. This connected source wiring or drain wiring is manufactured in the step of forming the source wiring or the drain wiring in Embodiment 1. A drain wiring of the second TFT 202 is connected to the lower electrode 155 of the light emitting element 159. The light emitting element 159 including the lower electrode 155, the organic light emitting layer 157, and the upper electrode 158 emits light from the organic light emitting layer in a direction indicated by an arrow (an opposite direction to the substrate) by adding the electric field to the organic light emitting layer 157.

Figure 8:
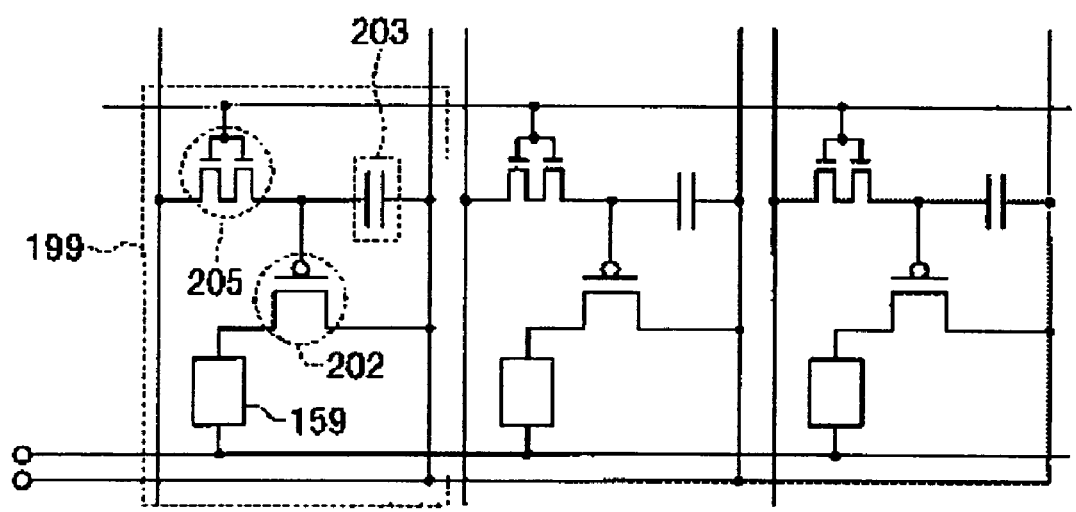
FIG. 8 is a circuit diagram of an EL light emitting device shown in FIG. 7.

FIG. 8 shows a circuit diagram of the EL light emitting device shown in FIG. 7. The same portion as FIG. 7 is denoted by the same reference numeral. As shown in FIG. 8, one pixel is constituted by a portion surrounded by a dot line 199. One pixel includes the first TFT 205, the second TFT 202, the capacitor element 203, and the light emitting element 159. The first TFT 205 is connected to the capacitor element 203 and the second TFT 202. The second TFT 202 is connected to the light emitting element 159.

Figure 9:
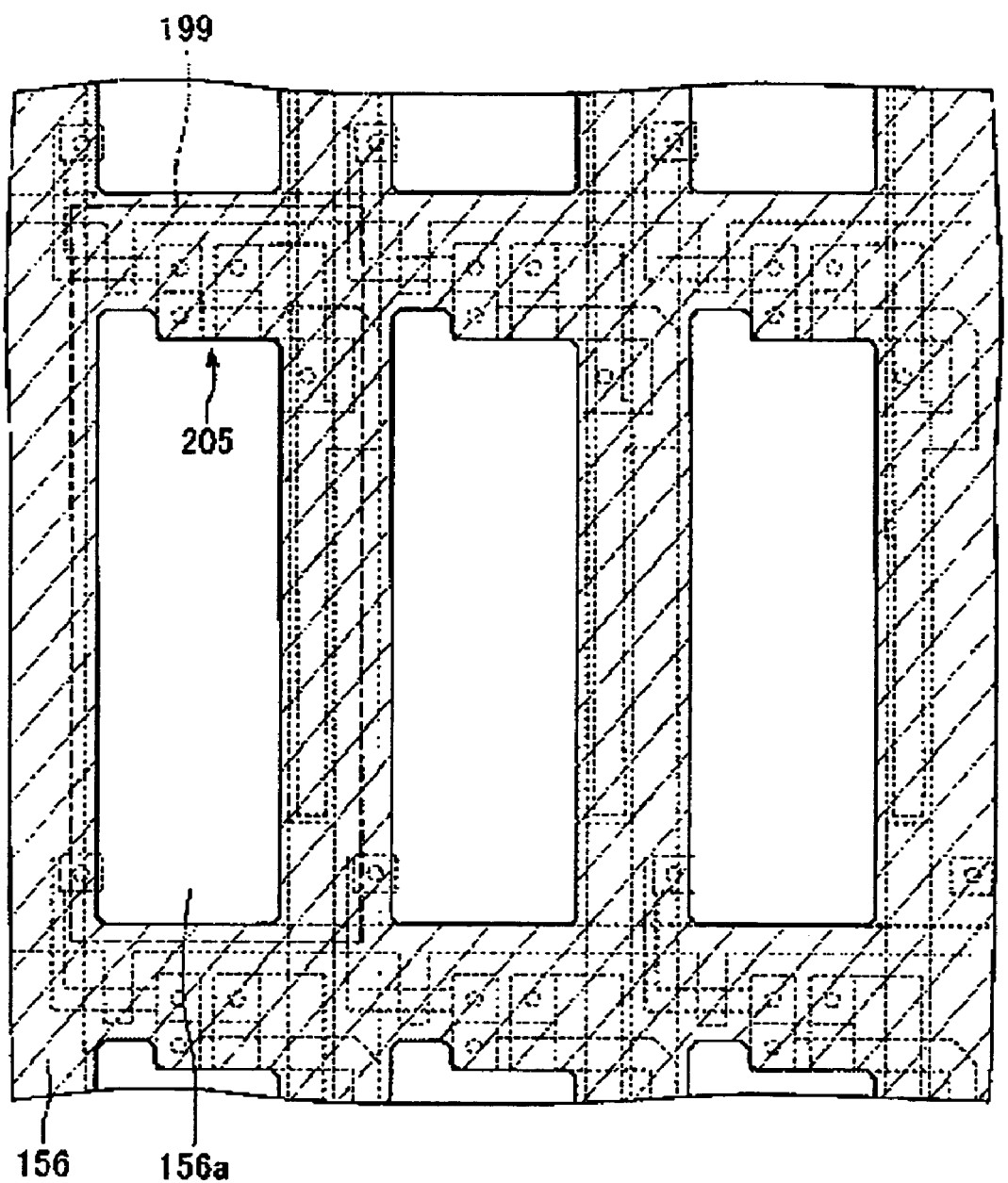
FIG. 9 is a top view of an EL light emitting device shown in FIG. 7.

FIG. 9 shows a top view of the EL light emitting device shown in FIG. 7. The same portion as FIG. 7 is denoted by the same reference numeral. As shown in FIG. 9, one pixel is constituted by a portion surrounded by a dot line 199, and the resin BM layer 156 having a BM opening portion 156a is arranged over an entire surface of the pixel. The light emitting element shown in FIG. 7 is arranged in the BM opening portion 156a. The first TFT, the second TFT, and the capacitor element shown in FIG. 7 are arranged below the resin BM layer 156. The resin BM layer has also a function as an insulating material between the wirings and another element. An electrode is stacked over the resin BM layer; therefore, a small taper angle is required so as to prevent disconnection.

In Embodiment 2, the similar effect as that of Embodiment 1 can be obtained. Further, the similar modification example as that of Embodiment Mode 2 can be implemented.

Embodiment 3

In this embodiment, a method for manufacturing a light emitting display device provided with an electroluminescent element, which is formed by Embodiment 1 or 2, will be explained. An electroluminescent element is, for example, an EL (Electro Luminescence) element, which includes an organic light emitting layer including an organic compound (an organic light emitting material) that emits light by adding the electric field, an anode, and a cathode. As for a light emitting display device using an electroluminescent element, a TFT is a required element so as to realize an active matrix driving method. In other words, in the light emitting display device using the electroluminescent element, a TFT serving as a switching element and a TFT supplying a-current to the electroluminescent element are at least provided in each pixel.

In this light emitting display device, in order to make a clear difference of light and dark in an image and to display black color more vividly, a resin BM that has vividly black color is preferably used as a partition. In this embodiment, a black resin BM is used as a partition; therefore, a difference of light and dark in an image can be clearly displayed. Hereinafter, the same structure as Embodiment 1 or 2 is denoted by the same reference numeral and explanation thereof is omitted.

FIG. 10A shows a top view for showing a display module, and FIG. 10B shows a cross-sectional view taken along A-A' of FIG. 10A. A pixel portion 207 is formed over a central part of a substrate 100. A source side driver circuit 206a and a gate side driver circuit 206b are formed in a driver circuit portion. Further, a sealing substrate 1a is arranged above the substrate 100. A space between the substrate 100 and the sealing substrate 1a is sealed with a sealing material 518.

A wiring 508 is arranged in a portion over the substrate 100, which is not overlapped with the sealing substrate 1a. The wiring 508 is a wiring to receive a video signal and a clock signal from an FPC 509 that becomes an external input terminal and to transport these signals to the source side driver circuit 206a and the gate side driver circuit 206b. Although only the FPC is shown here, this FPC may be provided with a printed wiring board (PWB). A light emitting device of the present specification includes not only a light emitting device itself but also the light emitting device provided with an FPC or a PWB.

Next, a cross-sectional structure will be explained with reference to FIG. 10B. A base insulating film 101 is provided over the substrate 100, and the pixel portion 207 and the gate side driver circuit 206b are formed over the base insulating film 101. In the pixel portion 207, a current control TFT 511, a plurality of pixels including a first electrode 512 electrically connected to a drain of the current control TFT 511, and a switching TFT 513 are provided. Further, the gate side driver circuit 206b is formed using a CMOS circuit that combines an n-channel TFT 523 and a p-channel TFT 524. These TFTs (including TFTs 511, 513, 523, and 524) are reverse staggered type TFTs.

The first electrode 512 serves as a cathode of the electroluminescent element (an EL element). For the first electrode 512, a material having a low work function (Al, Ag, Li, or Ca; an alloy thereof such as MgAg, MgIn, AlLi, or CaF$_2$; or calcium nitride) is preferably used. An electroluminescent layer (for example, an EL layer) 516 and a second electrode 517 are formed over the first electrode 512.

The electroluminescent layer 516 is formed of a light emitting layer and a charge transporting layer or a charge injecting layer. However, these can be arbitrarily combined. For example, as a light emitting layer, a low molecular organic EL material or a high molecular organic EL material is preferably used. Alternatively, a thin film made of a light emitting material that emits light (fluorescence) by singlet excitation (a singlet compound) or a thin film made of a light emitting material that emits light (phosphorescence) by triplet excitation (a triplet compound) can be used. Further, an inorganic material such as silicon carbide can be used as the charge transporting layer and the charge injecting layer. In addition to the above materials, a known material can be used. It is to be noted that the electroluminescent layer 516 is formed by an evaporation method using an evaporation mask or a droplet discharging method (an ink jet method).

The second electrode 517 serves as an anode of the electroluminescent element. Also, the second electrode 517 serves as a wiring common to all pixels, which is electrically connected to the FPC 509 through the wiring 508. All elements included in the pixel portion 207 are covered with the electroluminescent layer 516 and the second electrode 517. However, the resin BM layer 156 is provided between each element expect for the first electrode 512 and the electroluminescent layer 516. For the second electrode 517, a material that is transparent or semitransparent to visible light and has a high work function (for example, a single-layer film such as indium tin oxide, indium zinc oxide, titanium nitride, chromium, tungsten, zirconium, or platinum; a stacked-layer film of a film that contains titanium nitride and aluminum as its main component; or a three-layer film of this stacked-layer film and a titanium nitride film) is preferably used. Further, the second electrode 517 may have a structure in which a transparent material (for example, indium tin oxide, In$_2$O$_3$—ZnO, or ZnO) is stacked over a thin metal film. When a stacked-layer structure is employed, wiring resistance is lowered, and favorable ohmic contact can be obtained.

A space between the substrate 1 and the sealing substrate 1a is filled with filler 507. As for the filler 507, an inert gas such as Ar, a sealing material, or a drying agent can be used.

By employing the above structure, a light emitting display device that emits light to the substrate 1 side can be obtained. Then, the light emitting element is sealed with the sealing material 518 and the protective film; therefore, the light emitting element can be shielded completely from the outside. As a result, intrusion of substances such as moisture and oxygen, which promote deterioration of the electroluminescent layer by oxidization, can be prevented. Accordingly, a highly reliable light emitting device can be obtained.

Further, as a modification example of Embodiment 3, both the first electrode 512 and the second electrode 517 may be formed of a material having a light transmitting property. In this case, the light emitting display device emits light to both the substrate 1 side and the sealing substrate 1a side.

Embodiment 4

A driver circuit and a pixel portion formed by implementing the present invention can be used for a display module (an active matrix electroluminescent module) as shown in Embodiment 3. In this embodiment, electronic apparatuses in which this display module is incorporated are shown.

As electronic apparatuses, a video camera, a digital camera, a car navigation system, a projector, a car stereo, a personal computer, a mobile information terminal (such as a mobile computer, a mobile phone, or an electronic book), and the like can be given. One example thereof is shown in FIGS. 11A to 11D and FIG. 12.

Figure 11A:
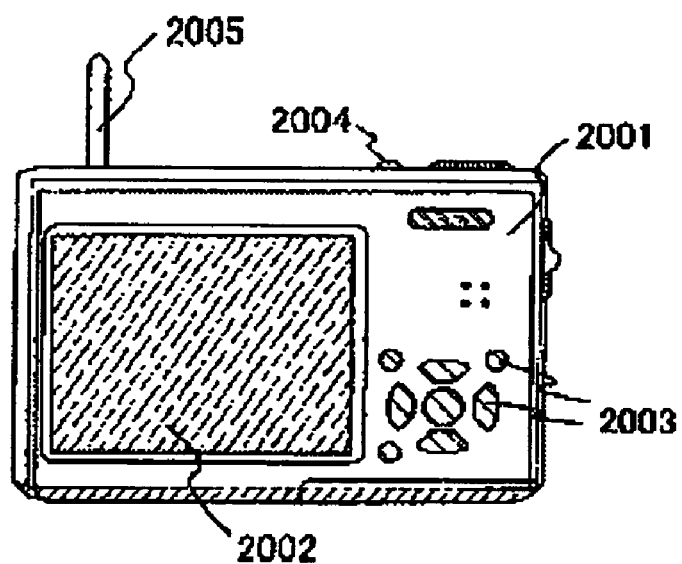
FIGS. 11A to 11D are schematic views of electronic apparatuses related to Embodiment 4, which use a display device manufactured by using the present invention.

FIG. 11A shows a digital camera, which includes a main body 2001, a display portion 2002, an imaging portion, operation keys 2003, a shutter 2004, an antenna 2005, and the like. A display module manufactured by the method shown in Embodiment 3 is used for this display portion 2002. It is to be noted that FIG. 11A is a view from a side of the display portion 2002 and the imaging portion is not shown.

Further, the digital camera of the present invention may make the display portion 2002 serve as a display medium of a television receiver or the like by receiving signals such as an image signal and an audio signal in the antenna 2005. A speaker, operation switches, and the like may be appropriately provided. By the present invention, a digital camera having a display portion, which has a high contrast of brightness or a high contrast of color, can be achieved.

Figure 11B:
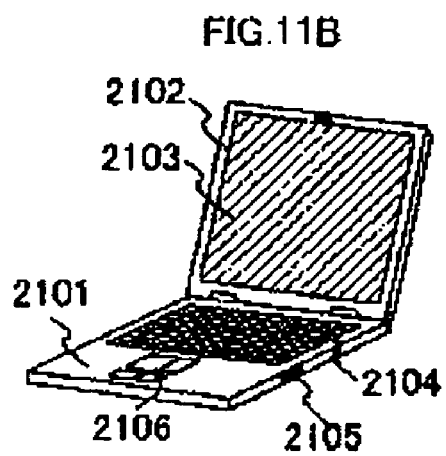

FIG. 11B shows a notebook personal computer, which includes a main body 2101, a chassis 2102, a display portion 2103, a keyboard 2104, an external connection port 2105, a pointing mouse 2106, and the like. A display module manufactured by the method shown in Embodiment 3 is used for the display portion 2103. By the present invention, a notebook personal computer having a display portion, which has a high contrast of brightness or a high contrast of color, can be achieved.

Figure 11C:
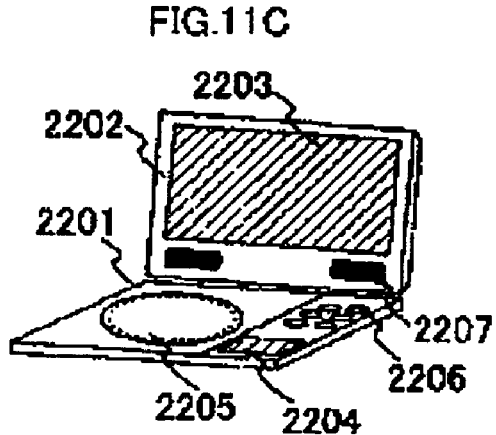

FIG. 11C shows a mobile image reproducing device equipped with a recording medium (specifically, a DVD reproducing device), which includes a main body 2201, a chassis 2202, a display portion A 2203, a display portion B 2204, a recording medium (such as a DVD) reading portion 2205, operation keys 2206, a speaker portion 2207, and the like. The display portion A 2203 mainly displays image information, and the display portion B 2204 mainly displays character information. It is to be noted that the image reproducing device equipped with a recording medium also includes a home game machine. A display module manufactured by the method shown in Embodiment 3 is used for the display portion A 2203 and the display portion B 2204. By the present invention, an image reproducing device having a display portion, which has a high contrast of brightness or a high contrast of color, can be achieved.

Figure 11D:
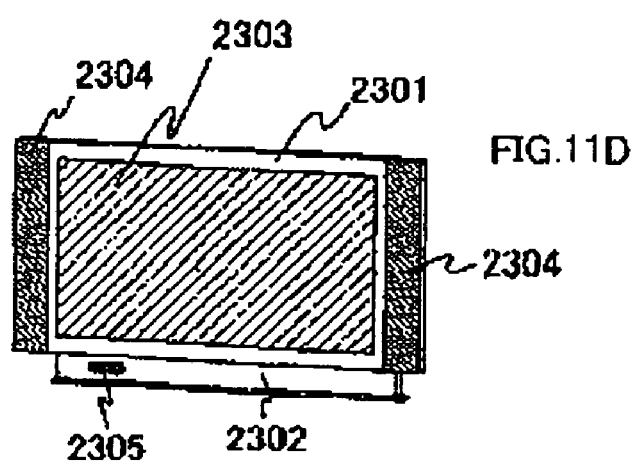

FIG. 11D shows a display device, which includes a chassis 2301, a support 2302, a display portion 2303, speakers 2304, a video input terminal 2305, and the like. A display module manufactured by the method shown in Embodiment 3 is used for the display portion 2303. It is to be noted that, the display device includes a liquid crystal display device, a light-emitting device, or the like. Specifically, the display device includes all kinds of display devices for displaying information, such as devices for a personal computer, for receiving TV broad casting, and for displaying an advertisement. In accordance with the present invention, a display device having a display portion, which has a high contrast of brightness or a high contrast of color, particularly a large-sized display device having a large screen of 22 to 50 inches can be achieved.

Figure 12:
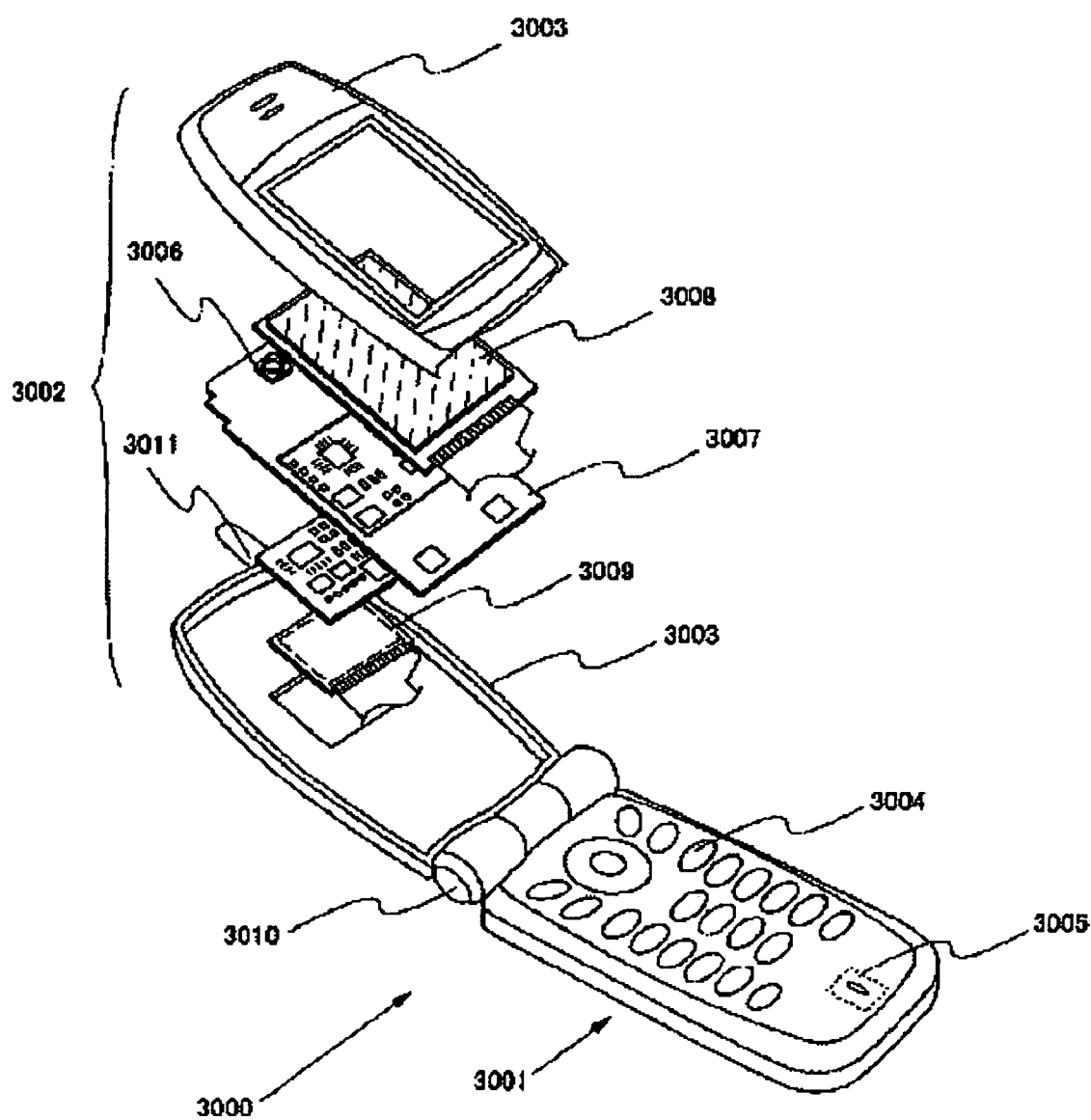
FIG. 12 is a schematic view of an electronic apparatus related to Embodiment 4, which uses a display device manufactured by using the present invention.

FIG. 12 shows a mobile phone, which includes a main body (A) 3001 provided with operation switches 3004, a microphone 3005, and the like, and a main body (B) 3002 provided with a display panel (A) 3008, a display panel (B) 3009, a speaker 3006, and the like. The main body (A) 3001 and the main body (B) 3002 are connected with a hinge 3010 so that the mobile phone can be opened or folded. The display panel (A) 3008 and the display panel (B) 3009 are incorporated into a chassis 3003 of the main body (B) 3002 together with a circuit substrate 3007. Pixel portions of the display panel (A) 3008 and the display panel (B) 3009 are arranged so as to be seen from an open window formed in the chassis 3003.

The specifications of the display panel (A) 3008 and the display panel (B) 3009 such as the number of pixels can be appropriately set in accordance with the function of a mobile phone 3000. For example, the display panel (A) 3008 and the display panel (B) 3009 can be used in combination so as to be used as a main display screen and a sub-display screen, respectively. A display module manufactured by the method shown in Embodiment 3 is used for the display panel (A) 3008 and the display panel (B) 3009.

The display panel (A) 3008 may serve as a display medium of a television receiver or the like by receiving signals such as an image signal or an audio signal in an antenna 3011.

In accordance with the present invention, a mobile information terminal having a display portion, which has a high contrast of brightness or a high contrast of color, can be achieved. Further, a mobile information terminal having a facility for a television can be achieved.

The mobile phone of the present invention can be changed into various modes in accordance with the function or applications. For example, by incorporating an imaging element into the hinge 3010, a mobile phone equipped with a camera can be provided. In addition, also in a case where the operation switches 3004, the display panel (A) 3008, and the display panel (B) 3009 are incorporated into one chassis, the aforementioned effect can be obtained. Further, when the structure of this embodiment mode is applied to an information display terminal having a plurality of display portions, a similar effect can be obtained.

A display module manufactured by the method shown in Embodiment Modes 1 and 2 and Embodiments 1 to 3 is used for the display portion, the display panel, or the like of the above electronic apparatus, whereby a highly reliable electronic apparatus having a high-definition display portion in which image quality such as a contrast of brightness or a contrast of color is improved, can be achieved. Further, an application range of the present invention is extremely wide, and the present invention can be applied to a method for manufacturing electronic apparatuses in various fields.

This application is based on Japanese Patent Application serial no. 2005-201941 filed in Japan Patent Office on July 11 in 2005, the entire contents of which are hereby incorporated by reference.

What is claimed is:

1. A method for manufacturing a semiconductor device, comprising:
    forming a non-photosensitive black resin layer over a substrate;
    forming a positive resist film over the non-photosensitive black resin layer;
    exposing a portion of the positive resist film to a light;
    developing the positive resist film and etching the non-photosensitive black resin layer wherein a first developing solution is used for the developing to remove the exposed portion of the positive resist film to form a resist pattern and is used for the etching to remove a portion of the non-photosensitive black resin layer under the removed portion of the positive resist film to form a resin black matrix under the resist pattern;
    exposing the resist pattern which remains after the removal of the exposed portion of the positive resist film to a light; and
    removing the resist pattern by using a second developing solution to leave the resin black matrix behind.

2. A method for manufacturing a semiconductor device according to claim 1,
    wherein the non-photosensitive black resin layer comprises polyimide.

3. A method for manufacturing a semiconductor device according to claim 1, wherein the first developing solution comprises tetramethylammonium hydroxide.

4. A method for manufacturing a semiconductor device according to claim 1,
wherein the second developing solution comprises tetramethylammonium hydroxide.

5. A method for manufacturing a semiconductor device according to claim 1,
wherein the semiconductor device is incorporated into one selected from the group consisting of a camera, a personal computer, an image reproducing device equipped with a recording medium, a display device, and a mobile phone.

6. A method for manufacturing a semiconductor device according to claim 1,
wherein the first developing solution has the same concentration as the second developing solution; and
wherein a processing time using the first developing solution is longer than a processing time using the second developing solution.

7. A method for manufacturing a semiconductor device according to claim 1,
wherein the first developing solution has the same concentration as the second developing solution; and
wherein a processing time using the first developing solution is more than twice longer than a processing time using the second developing solution.

8. A method for manufacturing a semiconductor device according to claim 1,
wherein the first developing solution has a higher concentration than the second developing solution; and
wherein a processing time using the first developing solution is equal to a processing time using the second developing solution.

9. A method for manufacturing a semiconductor device according to claim 1,
wherein the first developing solution has a higher concentration than the second developing solution; and
wherein a processing time using the first developing solution is less than four times a processing time using the second developing solution.

10. A method for manufacturing a light emitting device, comprising:
forming a non-photosensitive black resin layer over a substrate;
forming a positive resist film over the non-photosensitive black resin layer;
exposing a portion of the positive resist film to a light;
developing the positive resist film and etching the non-photosensitive black resin layer wherein a first developing solution is used for the developing to remove the exposed portion of the positive resist film to form a resist pattern and is used for the etching to remove a portion of the non-photosensitive black resin layer under the removed portion of the positive resist film to form a resin black matrix under the resist pattern;
exposing the resist pattern which remains after the removal of the exposed portion of the positive resist film to a light; and
removing the resist pattern by using a second developing solution to leave the resin black matrix behind.

11. A method for manufacturing a light emitting device according to claim 10,
wherein the non-photosensitive black resin layer comprises polyimide.

12. A method for manufacturing a light emitting device according to claim 10,
wherein the first developing solution comprises tetramethylammonium hydroxide.

13. A method for manufacturing a light emitting device according to claim 10,
wherein the second developing solution comprises tetramethylammonium hydroxide.

14. A method for manufacturing a light emitting device according to claim 10,
wherein the light emitting device is incorporated into one selected from the group consisting of a camera, a personal computer, an image reproducing device equipped with a recording medium, a display device, and a mobile phone.

15. A method for manufacturing a light emitting device according to claim 10,
wherein the first developing solution has the same concentration as the second developing solution; and
wherein a processing time using the first developing solution is longer than a processing time using the second developing solution.

16. A method for manufacturing a light emitting device according to claim 10,
wherein the first developing solution has the same concentration as the second developing solution; and
wherein a processing time using the first developing solution is more than twice longer than a processing time using the second developing solution.

17. A method for manufacturing a light emitting device according to claim 10,
wherein the first developing solution has a higher concentration than the second developing solution; and
wherein a processing time using the first developing solution is equal to a processing time using the second developing solution.

18. A method for manufacturing a light emitting device according to claim 10,
wherein the first developing solution has a higher concentration than the second developing solution; and
wherein a processing time using the first developing solution is less than four times a processing time using the second developing solution.

19. A method for manufacturing a semiconductor device, comprising:
forming an electrode over an insulating film;
forming a non-photosensitive black resin layer over the electrode and the insulating film;
forming a positive resist film over the non-photosensitive black resin layer;
exposing a portion of the positive resist film to a light;
developing the positive resist film and etching the non-photosensitive black resin layer wherein a first developing solution is used for the developing to remove the exposed portion of the positive resist film to form a resist pattern and is used for the etching to remove a portion of the non-photosensitive black resin layer under the removed portion of the positive resist film to form a resin black matrix under the resist pattern with an opening of the resin black matrix formed over the electrode;
exposing the resist pattern which remains after the removal of the exposed portion of the positive resist film to a light; and
removing the resist pattern by using a second developing solution to leave the resin black matrix behind.

20. A method for manufacturing a semiconductor device according to claim 19,
wherein the non-photosensitive black resin layer comprises polyimide.

21. A method for manufacturing a semiconductor device according to claim 19,
wherein the first developing solution comprises tetramethylammonium hydroxide.

22. A method for manufacturing a semiconductor device according to claim 19,
wherein the second developing solution comprises tetramethylammonium, hydroxide.

23. A method for manufacturing a semiconductor device according to claim 19,
wherein the semiconductor device is incorporated into one selected from the group consisting of a camera, a personal computer, an image reproducing device equipped with a recording medium, a display device, and a mobile phone.

24. A method for manufacturing a semiconductor device according to claim 19,
wherein the first developing solution has the same concentration as the second developing solution; and
wherein a processing time using the first developing solution is longer than a processing time using the second developing solution.

25. A method for manufacturing a semiconductor device according to claim 19,
wherein the first developing solution has the same concentration as the second developing solution; and
wherein a processing time using the first developing solution is more than twice longer than a processing time using the second developing solution.

26. A method for manufacturing a semiconductor device according to claim 19,
wherein the first developing solution has a higher concentration than the second developing solution; and
wherein a processing time using the first developing solution is equal to a processing time using the second developing solution.

27. A method for manufacturing a semiconductor device according to claim 19,
wherein the first developing solution has a higher concentration than the second developing solution; and
wherein a processing time using the first developing solution is less than four times a processing time using the second developing solution.

28. A method for manufacturing a semiconductor device according to claim 19,
wherein a light emitting layer is formed over the electrode and the resin black matrix after removing the resist pattern; and
wherein an upper electrode, which is provided to be opposed to the electrode, is formed over the light emitting layer and the resin black matrix.

29. A method for manufacturing a semiconductor device according to claim 19,
wherein a thin film transistor and a capacitor element are formed below the insulating film before the electrode is formed over the insulating film.

30. A method for manufacturing a light emitting device, comprising:
forming an electrode over an insulating film;
forming a non-photosensitive black resin layer over the electrode and the insulating film;
forming a positive resist film over the non-photosensitive black resin layer;
exposing a portion of the positive resist film to a light;
developing the positive resist film and etching the non-photosensitive black resin layer wherein a first developing solution is used for the developing to remove the exposed portion of the positive resist film to form a resist pattern and is used for the etching to remove a portion of the non-photosensitive black resin layer under the removed portion of the positive resist film to form a resin black matrix under the resist pattern with an opening of the resin black matrix formed over the electrode;
exposing the resist pattern which remains after the removal of the exposed portion of the positive resist film to a light; and
removing the resist pattern by using a second developing solution to leave the resin black matrix behind.

31. A method for manufacturing a light emitting device according to claim 30,
wherein the non-photosensitive black resin layer comprises polyimide.

32. A method for manufacturing a light emitting device according to claim 30,
wherein the first developing solution comprises tetramethylammonium hydroxide.

33. A method for manufacturing a light emitting device according to claim 30,
wherein the second developing solution comprises tetramethylammonium hydroxide.

34. A method for manufacturing a light emitting device according to claim 30,
wherein the light emitting device is incorporated into one selected from the group consisting of a camera, a personal computer, an image reproducing device equipped with a recording medium, a display device, and a mobile phone.

35. A method for manufacturing a light emitting device according to claim 30,
wherein the first developing solution has the same concentration as the second developing solution; and
wherein a processing time using the first developing solution is longer than a processing time using the second developing solution.

36. A method for manufacturing a light emitting device according to claim 30,
wherein the first developing solution has the same concentration as the second developing solution; and
wherein a processing time using the first developing solution is more than twice longer than a processing time using the second developing solution.

37. A method for manufacturing a light emitting device according to claim 30,
wherein the first developing solution has a higher concentration than the second developing solution; and
wherein a processing time using the first developing solution is equal to a processing time using the second developing solution.

38. A method for manufacturing a light emitting device according to claim 30,
wherein the first developing solution has a higher concentration than the second developing solution; and
wherein a processing time using the first developing solution is less than four times a processing time using the second developing solution.

39. A method for manufacturing a light emitting device according to claim 30,
wherein a light emitting layer is formed over the electrode and the resin black matrix after removing the resist pattern; and wherein an upper electrode, which is provided to be opposed to the electrode, is formed over the light emitting layer and the resin black matrix.

40. A method for manufacturing a light emitting device according to claim 30, wherein a thin film transistor and a capacitor element are formed below the insulating film before the electrode is formed over the insulating film.

* * * * *